United States Patent [19]
Kato

[11] Patent Number: 5,319,599
[45] Date of Patent: Jun. 7, 1994

[54] REDUNDANCY CIRCUIT FOR SEMICONDUCTOR MEMORY DEVICE

[75] Inventor: Yasushi Kato, Tokyo, Japan

[73] Assignee: NEC Corporation, Japan

[21] Appl. No.: 874,627

[22] Filed: Apr. 27, 1992

[30] Foreign Application Priority Data
Apr. 27, 1991 [JP] Japan .................................. 3-124766

[51] Int. Cl.[5] ................................................ G11C 7/00
[52] U.S. Cl. .................................... 365/200; 365/201; 307/219; 307/441
[58] Field of Search ............... 365/200, 201; 371/10.3, 371/21.2, 21.4; 307/219, 441

[56] References Cited

U.S. PATENT DOCUMENTS

| | | | |
|---|---|---|---|
| 4,532,611 | 7/1985 | Countryman, Jr. | 365/200 |
| 4,567,580 | 1/1986 | Varshney | 365/200 |
| 5,018,104 | 5/1991 | Urai | 365/200 |

Primary Examiner—Eugene R. LaRoche
Assistant Examiner—Son Dinh
Attorney, Agent, or Firm—Laff, Whitesel, Conte, Saret

[57] ABSTRACT

A redundancy circuit for a semiconductor memory device has a first switching element composed of a nonvolatile memory cell and a second switching element composed of a data writtable and erasable element such as an EPROM. The circuit further has a test mode setting circuit which outputs an operation mode setting signal based on a signal inputted to a test terminal, and a switching element control circuit which controls the selection of the first and/or second switching elements based on the operation mode setting signal. A NOR circuit outputs a switching-signal as an output signal when switching data is written into at least one of the first and second switching elements. The switching data can be temporarily written into the second switching element even after assembly into the product has been completed, so that various kinds of inspections with the use of the redundancy circuit are possible.

3 Claims, 2 Drawing Sheets

REDUNDANCY CIRCUIT FOR SEMICONDUCTOR MEMORY DEVICE

FIELD OF THE INVENTION

The present invention relates to a redundancy circuit for replacing defective memory cells with redundancy memory cells in a semiconductor memory device which has redundant characteristics.

DESCRIPTION OF THE RELATED ART

In recent years, the capacity increase of a semiconductor memory device is being advanced by miniaturization of component elements and, along with this, defects are more likely to occur in memory cells. As one of the relief methods for saving a semiconductor memory device in which defects have occurred in its memory cells is to provide a redundancy memory cell therein for replacing the defective memory cell with the redundancy memory cell.

In a semiconductor memory device in which redundancy memory cells are provided, switching elements are used to store information specifying which memory cell among a plurality of the memory cells is to be replaced with a redundancy memory cell. Polycrystalline silicon fuses are generally used as these switching elements, and they are arranged so that the fuses are cut by laser beam, and the defective memory cells are replaced with redundancy memory cells. However, in recent years, nonvolatile memory cells have come to be used instead of the polycrystalline silicon fuses.

In this type of switching elements, the switching data can be stored by charging a charge in a nonvolatile memory (UPROM). In semiconductor memory devices using this type of switching elements, if assembly is performed with the charge stored as it is after the switching is performed in the wafer state, there is a fear of the above mentioned nonvolatile characteristics being degraded by thermal hysteresis in the course of assemblage. To avoid this, the use of a redundancy circuit equipped with a first switching element (nonvolatile memory cell) which is used to perform switching after the assembly is completed and a second switching element which is used to perform switching temporarily during the inspection in the wafer state.

FIG. 1 is a circuit diagram showing a typical example of a conventional redundancy circuit.

A test mode setting circuit 1, based on a signal $S_T$ applied to a test terminal 10, outputs an operating mode setting signal A which indicates a normal mode or a test mode. A switching element control circuit 2, based on the signal A, outputs a plurality of gate control signals C1, C2, C3 and C5.

The gate control signal C1 is applied to a gate of an N-channel control transistor M1. A power supply voltage $V_{DD}$ is applied to the drain of the transistor M1, and the source of this transistor M1 is connected to a load transistor ML. The gate and the drain of the load transistor ML are connected to an input terminal of an inverter 16.

The gate control signals C2 and C3 are applied to the gates of an N-channel control transistor M2 and a first switching element TU consisting of an nonvolatile memory cell, respectively. The control transistor M2 and the first switching element TU are connected in series between a voltage terminal 12 to which a write voltage $V_P$ is applied and a ground terminal 13. A junction node formed by the control transistor M2 and the first switching element TU is connected to the input terminal of the inverter 16.

The gate control signal C5 is applied to a gate of a second switching element TE. The second switching element TE is formed by a Programmable Read-Only Memory (PROM) which can freely perform both the data write and data erase.

The following Table 1 shows the status values of the respective signals at each mode of the above explained conventional redundancy circuit.

TABLE 1

| | SIGNAL | | | | |
|---|---|---|---|---|---|
| | A | C1 | C2 | C3 | C5 |
| FUSE-ELEMENT SWITCHING AT NORMAL MODE | NORMAL MODE | L | $V_P$ | $V_P$ | L |
| NORMAL USE AT NORMAL MODE | NORMAL MODE | H | L | H | L |
| FUSE-ELEMENT SWITCHING AT TEST MODE | TEST MODE | L | $V_P$ | L | $V_P$ |
| NORMAL USE AT NORMAL MODE | TEST MODE | H | L | L | H |

In the conventional redundancy circuit, during the wafer inspection period, in the case where a particular signal is applied to the test terminal 10 and the output A of the test mode setting circuit 1 is made active, as shown in the column of the fuse-element switching at test mode in the table 1, signals "L", "$V_P$", "L" and "$V_P$" are outputted as the gate control signals C1, C2, C3 and C5, respectively, from the switching element control circuit 2. In response to the above signals, the second switching element TE is selected and the switching data is written in this second switching element TE. Thereafter, in the case where the inspection is to be conducted in the wafer state, as shown in the column of the normal use at test mode in the table, the signals "H", "L", "L" and "H" are outputted as the control signals C1, C2, C3 and C5 from the switching element control circuit 2. In response to these control signals in this case, the second switching element TE and the first switching element TU become selected state and non-selected state, respectively, and thus the switching data from the second switching element TE is applied to the inverter 6. The inverter outputs an output signal $S_{OUT}$ at an output terminal 11. When the inspection under the wafer state is completed, the data stored in the second switching TE is erased.

On the other hand, in the inspection of products after assemblage, as shown in the column of the fuse-element switching at normal mode in the table, the signals "L", "$V_P$", "$V_P$" and "L" are outputted as the gate control signals C1, C2, C3 and C5, respectively, from the switching element control circuit 2. In response to these control signals, the switching data is written in the first switching element TU. Thereafter, as shown in the column of the normal use at normal mode in the table, the signals "H", "H" and "L" are outputted from the control circuit 2 as the control signals C1, C2, C3 and C5, respectively. In response thereto, the first switching element TU and the second switching element TE become the selected state and the non-selected state, respectively, and thus the switching data is outputted from the first switching TU to the inverter 16. This switching data is inverted by the inverter 16 and then outputted as the output signal $S_{OUT}$ from the terminal 11.

In this redundancy circuit, where the switching data is written in either the switching element TU or the switching element TE, a switching-signal (L), which indicates that the switching has been effected, is outputted as the output signal $S_{OUT}$. On the contrary, where no signal is written in both the switching elements TU and TE, non-switching-signal (H), which indicates that the switching has not been effected, is outputted as the output signal $S_{OUT}$. A combination of a plurality of output signals from a plurality of redundancy circuits forms a replacement information which is related to the replacement of the defective memory cells with the redundancy memory cells.

However, the above explained conventional redundancy circuit has the following defects or problems. Specifically, in the conventional redundancy circuit, the circuit is provided with two modes, that is, the normal mode and the test mode, and the first and second switching element TU and TE are separately or selectively used at the wafer state and after the assemblage. In other words, in order to write the switching data into the second switching element TE which has the data write function and the data erase function, it is necessary to apply the above-mentioned particular test signal $S_T$ to the test terminal 10, thereby rendering the device to be in the test mode. Therefore, the common use of the test terminal 10 with existing terminals (for example, an address input terminal) is difficult. Also, because the provision of a test terminal to the package after the assemblage into the product has been once completed is not practical, the use of the test terminal 10 is limited to inspections in the wafer state.

If the evaluation of the parts can be performed with the use of the redundancy circuit after assembly into the product has been completed, tests such as the evaluation of the access time delay can be performed, whereby the reliability and the quality of the semiconductor memory devices can be improved or enhanced even more. For this reason, even after the product has been assembled, a redundancy circuit in which data can be temporarily written is in demand.

SUMMARY OF THE INVENTION

It is, therefore, a primary object of the invention to overcome the problems existing in the conventional redundancy circuit and to provide an improved redundancy circuit in which the test mode can be used even after the assembly into the product has been completed, whereby the reliability and quality of the semiconductor memory device are further improved.

According to one aspect of the invention, there is provided a redundancy circuit for replacing defective memory cells with redundancy memory cells in a semiconductor memory device, the redundancy circuit comprising:

a first switching element which is composed of a nonvolatile memory cell and into which switching data can be written;

a second switching element into which the switching data can be written and from which the switching data can be erased as desired;

a test mode setting circuit which outputs an operation mode setting signal based on a test signal inputted to a test terminal;

a switching element control circuit which controls operation of the first and second switching elements based on the operation mode setting signal from the test mode setting circuit; and an output circuit which outputs a switching-signal when the switching data is written into at least one of the first and second switching elements.

According to this invention, there are provided a first switching element which is composed of a nonvolatile memory cell and a second switching element which can perform the data write and the data erase. Based on the signals inputted to the test terminal, the test mode setting circuit and the switching element control circuit control the operation of the above mentioned first and second switching elements. Thus, in the circuit according to the invention, data can be written in the first and second switching elements based on the signals applied to the test terminal, even after the assembly into the product has been completed. Especially, because the second switching element can perform the data write and the data erase, the data temporarily written into this second switching element for the purpose of inspection can be erased after such inspection has been effected. Also, in this invention, because the circuit is so devised that the output circuit outputs the switching-signal in the case where the data has been written into either the first or second switching element, the switching-signal is outputted irrespective of the test mode or the normal mode whereby the circuit can operate as a redundancy circuit. As a result, a variety of inspections can be performed even after the device is assembled into the product.

As the second switching element which can perform both the data write and the data erase, a device such as an Erasable Programmable Read-Only Memory (EPROM) in which the written data can be erased by ultraviolet rays can be used. Instead of the above EPROM, a combination of a latch which can store the data and an ordinary MOS field effect transistor which is driven by the output from the latch can be also used as the second switching element.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Figure 1:
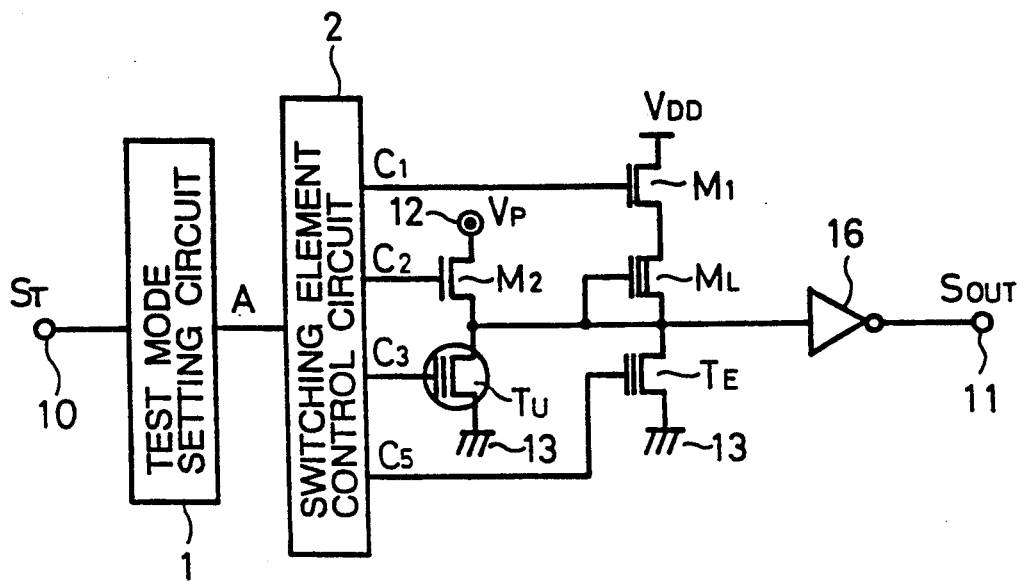
FIG. 1 is a circuit diagram of a typical conventional redundancy circuit.

Now, some preferred embodiments of the invention will be explained with reference to the accompanying drawings. The same reference numerals or symbols used in the conventional circuit shown in FIG. 1 are also used in FIGS. 2 and 3 showing the embodiments of the invention, for the same or like elements.

Figure 2:
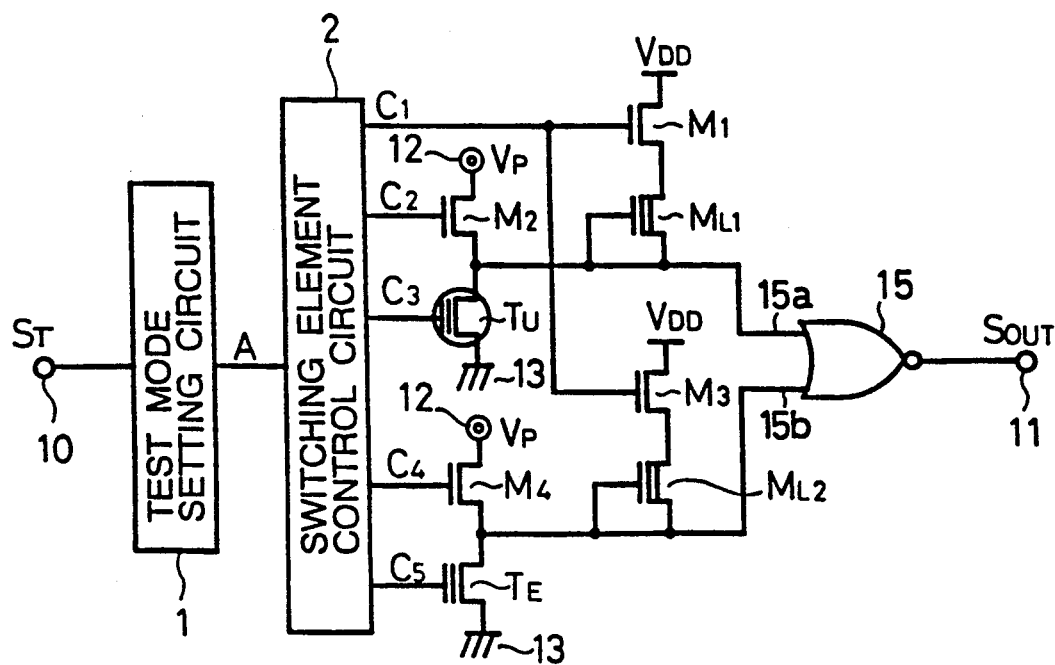
FIG. 2 is a circuit diagram of a redundancy circuit of a first embodiment according to the invention.
Figure 3:
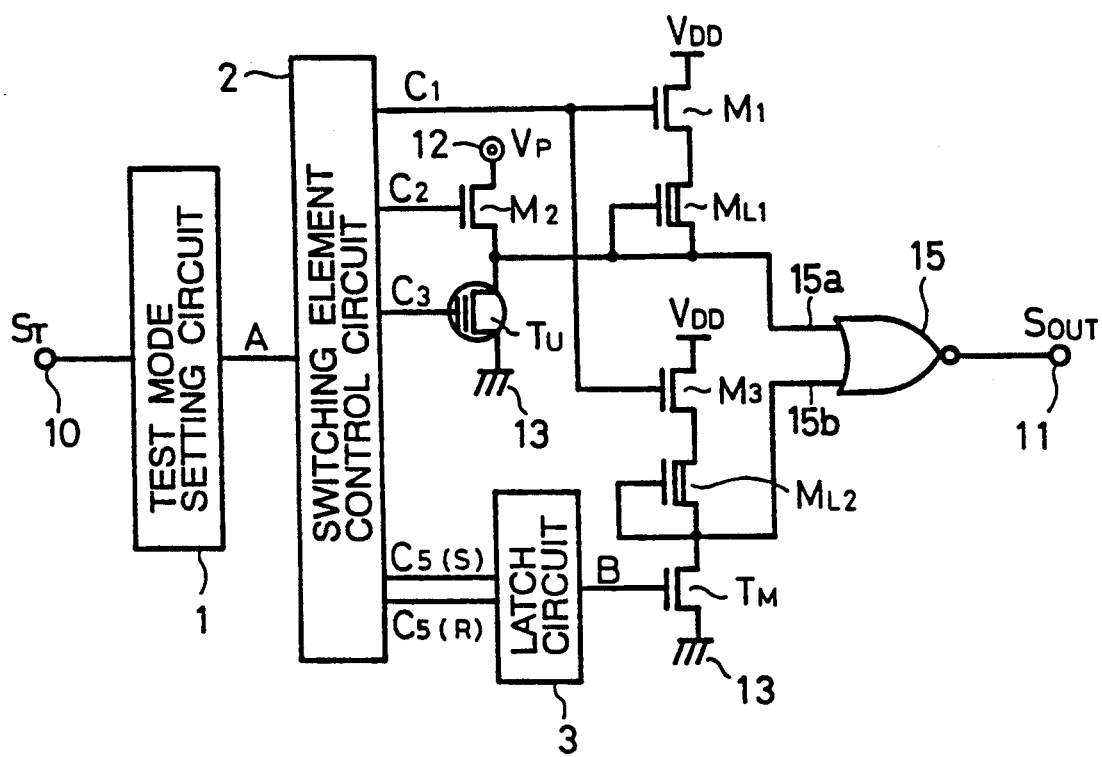
FIG. 3 is a circuit diagram of a redundancy circuit of a second embodiment according to the invention.

FIG. 2 is a circuit diagram showing a redundancy circuit of the first embodiment according to the invention.

The signal $S_T$ applied to the test terminal 10 is forwarded to the test mode setting circuit 1. In response to this signal $S_T$, the test mode setting circuit 1 outputs a signal A which determines the operation mode, that is, the normal mode or the test mode. The switching element control circuit 2, based on this operation mode setting signal A, outputs a plurality of control signals C1, C2, C3, C4 and C5.

The control signal C1 is applied to the respective gates of N-channel control transistors M1 and M3. Each of the N-channel transistors M1 and M3 has a drain connected to the power supply voltage $V_{DD}$ and a source connected to each of load transistors ML1 and ML2. The gate and the drain of the one load transistor ML1 are connected to one input terminal 15a of a two-input NOR circuit 15, and the gate and the drain of the other load transistor ML2 are connected to the other input terminal 15b of the same NOR circuit 15.

The control signals C2 and C3 are applied to the gate of the N-channel control transistor M2 and to the gate of the first switching element TU which is composed of a nonvolatile memory cell (UPROM), respectively. A series circuit formed by the control transistor M2 and the first switching element TU is connected between the voltage terminal 12 to which the write voltage $V_P$ is applied and the ground terminal 13. A junction node formed by the control transistor M2 and the first switching element TU is connected to the one input terminal 15a of the above mentioned NOR circuit 15.

The control signals C4 and C5 are applied to the gate of the N-channel control transistor M4 and to the gate of the second switching element TE, respectively. As already explained, this second switching element TE is formed by an element such as an EPROM which can perform the data write and the data erase. A series circuit of the control transistor M4 and the second switching element TE is also connected between the voltage terminal 12 and the ground terminal 13. A junction node formed by the control transistor M4 and the second switching element TE is connected to the other input terminal 15b of the NOR circuit 15.

The following Table 2 shows the status values of the respective signals at each mode in the redundancy circuit of the above explained first embodiment.

TABLE 2

| | | SIGNAL | | | | |
|---|---|---|---|---|---|---|
| | A | C1 | C2 | C3 | C4 | C5 |
| FUSE-ELEMENT SWITCHING AT NORMAL MODE | NORMAL MODE | L | $V_P$ | $V_P$ | L | L |
| NORMAL USE AT NORMAL MODE | NORMAL MODE | H | L | H | L | H |
| FUSE-ELEMENT SWITCHING AT TEST MODE | TEST MODE | L | L | L | $V_P$ | $V_P$ |

In the case where the switching data is written into the first switching element TU, as shown in the column of the fuse-element switching at normal mode in the table 2, the switching element control circuit 2 outputs the signals "L", "$V_P$", "$V_P$", "L" and "L" as the gate control signals C1, C2, C3, C4 and C5, respectively. Based on these signals, the switching data is written in the first switching element TU.

On the other hand, in the case where the switching data is written into the second switching element TE, as shown in the column of the fuse-element switching at test mode in table 2, the signals "L", "L", "L", $V_P$ and $V_P$ are outputted from the switching element control circuit 2 as the gate control signals C1, C2, C3, C4 and C5, respectively. Based on these gate control signals, the switching data is written into the second switching element TE.

In the normal use, to the first and second switching elements TU and TE, as shown in the column of the normal use at normal mode in the table 2, the signals "H", "L", "H", "L" and "H" are outputted from the switching control circuit 2 as the gate control signals C1, C2, C3, C4 and C5, respectively. In this case, the first switching element TU and the second switching element TE are selected simultaneously, and the NOR circuit 15 outputs an output resulting from the logical NOR operation on the drain signal of the first switching element TU and the second switching element TE. As a result, if the switching data has been written in the first switching element TU or the second switching element TE, the switching-signal (L) is outputted as the output signal $S_{OUT}$, whereby the circuit functions as a redundancy circuit.

In this embodiment, whether the data is written into the first switching element TU or the second switching element TE is decided by whether the device is operated in the test mode or the normal mode. Then, even after the wafer is assembled into the package and the device is assembled into the product, the switching data can be written into the first switching element TU or the second switching element TE as desired. Also, if the switching data is written in either the first or second switching element, the output of the redundancy is effective in the normal use at normal mode. In other words, in the redundancy circuit of this embodiment, even after it is assembled into the product, the data write in and the data erase from the second switching element is possible. As a result, when the product is evaluated, because the second switching element which can temporarily store the switching data can be used, a number of different combinations of switching are possible with the same product, and the evaluation of the access time delay can be investigated in detail, and this has the effect of improving the reliability and the quality of the product.

FIG. 3 is a circuit diagram of a redundancy circuit of the second embodiment according to the invention.

The difference in this embodiment from the above explained first embodiment resides in that the second switching element is formed by an MOS field effect transistor TM and a latch circuit 3 which drives the MOS transistor TM. Because the circuit configuration of the remaining parts is basically the same as that of the first embodiment, the same or like parts in FIG. 3 are shown by the same reference numerals or symbols as in FIG. 2, and the detailed explanations thereof are omitted here.

In this second embodiment, control signals C5(S) and C5(R) are outputted from the switching element control circuit 2 as a set signal and a reset signal, respectively. The latch circuit 3 outputs a signal B based on the control signals C5(S) and C5(R).

The MOS transistor TM is connected between the other input terminal 15b of the NOR circuit 15 and the ground terminal 13, and the output signal B of the latch circuit 3 is applied to the gate of this MOS transistor TM.

The following Table 3 shows the status values of the respective signals at each operation mode.

TABLE 3

| | A | C1 | C2 | C3 | C5 S | C5 R | B |
|---|---|---|---|---|---|---|---|
| FUSE-ELEMENT SWITCHING AT NORMAL MODE | NORMAL MODE | L | $V_P$ | $V_P$ | L | H | L |
| NORMAL USE AT NORMAL MODE | NORMAL MODE | H | L | H | L | L | L or LATCH SIGNAL |
| FUSE-ELEMENT SWITCHING AT TEST MODE | TEST MODE | L | L | L | SET SIGNAL | L | LATCH SIGNAL |

In the case where the switching data is written in the first switching element TU, as shown in the column of the fuse-element switching at normal mode in the table 3, the signals "L", "$V_P$", "$V_P$" and "H" are outputted from the switching element control circuit 2 as the control signals C1, C2, C3, C5(S) and C5(R), respectively. Based on these control signals, the switching data is written into the first switching element TU.

In the case where the switching data is written into the MOS transistor TM, as shown in the column of the fuse-element switching at test mode in table 3, the signals "L", "L", "L", "set signal" and "L" are outputted from the switching element control circuit 2 as the control signals C1, C2, C3, C5(S) and C5(R), respectively. Based on these signals, the switching data is stored in the latch circuit 3. Thereafter, the signals "H", "L", "H", "L" and "L" are outputted, as shown in the column of the normal use at normal mode in the table 3, from the switching element control circuit 2 as the control signals C1, C2, C3, C5(S) and C5(R), respectively, and the status of the transistor TM becomes either ON or OFF in accordance with the stored data in the latch circuit 3. In this way, by the operation of the latch circuit 3 and the MOS transistor TM as the second switching element, the same effects as obtained in the first embodiment can be also attained with this second embodiment.

As has been explained hereinabove, the redundancy circuit according to the invention has the first switching element consisting of a nonvolatile memory cell, the second switching element which can perform the data write and the data erase, and the output circuit which outputs a switching-signal if the switching data is written in either the first or second switching element. Because the test mode setting circuit and the switching element control circuit control the operation of the first and second switching elements based on the test signal inputted to the test terminal, the data can be written into either the first or second switching element based on the signal inputted to the test terminal even after the assembly into the product has been once completed. In this way, even after the device has been assembled into the product, various kinds of inspections can be implemented using the redundancy circuit, whereby the reliability and the quality of the semiconductor memory device can be improved even more.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A redundancy circuit for replacing defective memory cells with redundancy memory cells in a semiconductor memory device, said redundancy circuit comprising:
   a first switching element which is composed of a nonvolatile memory cell and into which switching data can be written;
   a second switching element into which said switching data can be written and from which said switching data can be erased as desired;
   a test mode setting circuit which outputs an operation mode setting signal based on a test signal inputted to a test terminal;
   a switching element control circuit which controls operation of said first and second switching elements based on said operation mode setting signal from said test mode setting circuit; and
   an output circuit which outputs a switching-signal when said switching data is written into at least one of said first and second switching elements said output circuit is composed of two-input NOR circuit having one input terminal connected to an output of said first switching element and the other input terminal connected to an output of said second switching element.

2. A redundancy circuit according to claim 1, in which said second switching element is composed of an erasable programmable read-only memory (EPROM) wherein written data can be erased by radiation of ultraviolet rays.

3. A redundancy circuit according to claim 1, in which said second switching element is composed of a latch circuit and a MOS field effect transistor driven by an output of said latch circuit.

* * * * *